(12) United States Patent
Van Brunt et al.

(10) Patent No.: US 9,515,199 B2
(45) Date of Patent: Dec. 6, 2016

(54) POWER SEMICONDUCTOR DEVICES HAVING SUPERJUNCTION STRUCTURES WITH IMPLANTED SIDEWALLS

(71) Applicant: Cree, Inc., Durham, NC (US)

(72) Inventors: Edward Robert Van Brunt, Morrisville, NC (US); Vipindas Pala, Morrisville, NC (US); Lin Cheng, Chapel Hill, NC (US); Daniel J. Lichtenwalner, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/588,527

(22) Filed: Jan. 2, 2015

(65) Prior Publication Data

US 2016/0197201 A1 Jul. 7, 2016

(51) Int. Cl.
*H01L 29/872* (2006.01)
*H01L 29/06* (2006.01)
*H01L 29/16* (2006.01)

(52) U.S. Cl.
CPC ......... *H01L 29/872* (2013.01); *H01L 29/0634* (2013.01); *H01L 29/0684* (2013.01); *H01L 29/1608* (2013.01)

(58) Field of Classification Search
CPC ............. H01L 29/0619; H01L 29/0634; H01L 29/404; H01L 24/05; H01L 29/7811; H01L 29/66734; H01L 29/7813; H01L 29/0878; H01L 29/1095; H01L 29/42368
USPC ................ 257/329, 341, 334, 495
See application file for complete search history.

(56) References Cited

U.S. PATENT DOCUMENTS

| | | | | |
|---|---|---|---|---|
| 2008/0303114 A1* | 12/2008 | Shibata | ............... | H01L 29/0634 257/495 |
| 2011/0248335 A1* | 10/2011 | Higashida | ........... | H01L 29/0634 257/329 |
| 2012/0098064 A1* | 4/2012 | Onishi | ................ | H01L 29/0619 257/341 |
| 2013/0037852 A1* | 2/2013 | Tamaki | ............... | H01L 29/7811 257/139 |
| 2014/0191309 A1* | 7/2014 | Eguchi | ................ | H01L 29/0619 257/329 |

OTHER PUBLICATIONS

Fujihira, Tatsuhiko. "Theory of Semiconductor Superjunction Devices." *Japanese Journal of Applied Physics* 36.Part 1, No. 10 (1997): 6254-262.

(Continued)

*Primary Examiner* — Dung Le
(74) *Attorney, Agent, or Firm* — Myers Bigel, P.A.

(57) ABSTRACT

A semiconductor device has a drift region having an upper surface and a lower surface. A first contact is on the upper surface of the drift region and a second contact is on the lower surface of the drift region. The drift region includes a first semiconductor pillar that has a tapered sidewall and that is doped with first conductivity type impurities and a second semiconductor pillar on the tapered sidewall of the first semiconductor pillar, the second semiconductor pillar doped with second conductivity type impurities that have an opposite conductivity from the first conductivity type impurities.

20 Claims, 7 Drawing Sheets

(56) References Cited

OTHER PUBLICATIONS

Li, Zhongda; Naik, Harsh and Chow, T. Paul. "Design of GaN and SiC 5-20kV Vertical Superjunction Structures." Center for Integrated Electronics, Rensselaer Polytechnic Institute, 2012 IEEE.
Kosugi, Ryoji, "First Experimental Demonstration of SiC Super-Junction (SJ) Structure by Multi-Epitaxial Growth Method." Proceedings of the 26$^{th}$ International Symposium on Power Semiconductor Devices & IC's, Jun. 15-19, 2014, Waikoloa, Hawaii, pp. 346-349.
Kosugi, Ryoji. "Development of SiC Super-Junction (SJ) Device by Deep Trench-Filling Epitaxial Growth." *Materials Science Forum*, vol. 740-742 (2013) pp. 785-788.

* cited by examiner

POWER SEMICONDUCTOR DEVICES HAVING SUPERJUNCTION STRUCTURES WITH IMPLANTED SIDEWALLS

STATEMENT OF U.S. GOVERNMENT INTEREST

This invention was made with Government support under Contract No. N00014-10-D-0145 awarded by the Office of Naval Research. The Government has certain rights in the invention.

FIELD OF THE INVENTION

The present invention relates to power semiconductor devices and, more particularly, to power semiconductor devices having superjunction structures and to methods of fabricating such devices.

BACKGROUND

Power semiconductor devices are widely used to carry large currents and support high voltages. A wide variety of power semiconductor devices are known in the art including, for example, power Metal Oxide Semiconductor Field Effect Transistors ("MOSFET"), Insulated Gate Bipolar Transistors ("IGBT"), Schottky diodes, Junction Barrier Schottky ("JBS") diodes, merged p-n Schottky ("MPS") diodes, Gate Turn-Off Transistors ("GTO"), MOS-controlled thyristors and various other devices. Modern power semiconductor devices are generally fabricated from monocrystalline silicon semiconductor material, or, more recently, from silicon carbide ("SiC") or gallium nitride ("GaN") based semiconductors.

Power semiconductor devices can have a lateral structure or a vertical structure. In a lateral structure, the terminals of the device (e.g., the drain, gate and source terminals for a power MOSFET device) are on the same major surface (i.e., top or bottom) of a semiconductor layer structure. In contrast, in a vertical structure, terminals are provided on both major surfaces of the semiconductor layer structure (e.g., in a vertical MOSFET, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes at least two semiconductor layers in a stacked relationship or to at least a single semiconductor layer having regions that are doped with different types of dopants.

A conventional silicon carbide power device typically has a silicon carbide substrate such as a silicon carbide wafer having a first conductivity type (e.g., an n-type substrate) on which an epitaxial layer having the first conductivity type (e.g., n-type) is formed. This epitaxial layer (which may comprise one or more separate layers) functions as a drift region of the power semiconductor device. The device typically includes an "active region" which includes one or more power semiconductor devices that have a p-n junction and/or a Schottky junction. The active region may be formed on and/or in the drift region. The active region acts as a main junction for blocking voltage in the reverse bias direction and providing current flow in the forward bias direction. The device may also have an edge termination region that is adjacent the active region. One or more power semiconductor devices may be formed on the substrate, and each power semiconductor device will typically have its own edge termination. After the substrate is fully formed and processed, the substrate may be diced to separate the individual edge-terminated power semiconductor devices if multiple devices are formed on the same substrate. In many cases, the power semiconductor devices on the substrate may have a unit cell structure in which the active region of each power semiconductor device includes a large number of individual devices that are disposed in parallel to each other and that together function as a single power semiconductor device.

Power semiconductor devices are designed to block (in the forward or reverse blocking state) or pass (in the forward operating state) large voltages and/or currents. For example, in the blocking state, a power semiconductor device may be designed to sustain tens, hundreds or thousands of volts of electric potential, or even higher voltages. However, as the voltage approaches or passes the voltage level that the device is designed to block, non-trivial levels of current may begin to flow through the power semiconductor device. Such current, which is typically referred to as "leakage current," may be highly undesirable. Leakage current may begin to flow if the voltage is increased beyond the design voltage blocking capability of the device, which may be a function of, among other things, the doping and thickness of the drift layer. However, current leakage can occur for other reasons, such as failure of the edge termination and/or the primary junction of the device. If the voltage on the device is increased past the breakdown voltage to a critical level which is referred to as the theoretical avalanche breakdown point, the increasing electric field may result in runaway generation of charge carriers within the semiconductor device, leading to a condition known as avalanche breakdown. When avalanche breakdown occurs, the reverse current increases sharply and typically becomes uncontrollable. When uncontrolled, such failures are generally catastrophic, and may damage or destroy the power semiconductor device.

A power semiconductor device may also begin to break down and allow non-trivial amounts of leakage current to flow at a voltage that is lower than the design breakdown voltage of the device. In particular, leakage current may begin to flow at the edges of the active region, where high electric fields may be experienced due to electric field crowding effects. In order to reduce this electric field crowding (and the resulting increased leakage currents), edge termination structures may be provided that surround part or all of the active region of a power semiconductor device. These edge terminations may spread the electric field out over a greater area, thereby reducing the electric field crowding.

Conventionally, a tradeoff exists in vertical power semiconductor devices between the breakdown voltage of the device and the doping level of the drift region. In particular, to increase the breakdown voltage of the device, it was necessary to decrease the doping concentration of the drift region and to increase the thickness of the drift region. Since the drift region is the current path for the device in the forward "on" state, the decreased doping concentration in the drift region may result in a higher on-state resistance for the device, which may be undesirable in many applications.

Recently, superjunction-type drift regions have been introduced in which the drift region is divided into alternating, side-by-side heavily-doped n-type and p-type regions. In vertical semiconductor devices, these side-by-side n-type and p-type regions are often referred to as "pillars." The thickness and doping of these pillars may be controlled so that the superjunction will act like a p-n junction with low resistance and a high breakdown voltage.

FIG. 1 is a schematic cross-sectional diagram of a conventional power semiconductor device in the form of a JBS diode 10 that has a superjunction-type drift region 30. As shown in FIG. 1, the JBS diode 10 includes a cathode contact 20, an ohmic contact layer 22, an n-type substrate 24, a drift region 30 a p-type blocking junction 40, a channel region 46, a Schottky contact 42 and an anode contact 44. The cathode contact 20 and the anode contact 44 may each comprise a highly conductive metal layer. The Schottky contact 42 may comprise a layer that forms a Schottky junction with the drift region 30 and may comprise, for example, an aluminum layer. The n-type substrate 24 may comprise a silicon carbide substrate that is heavily doped with n-type impurities such as nitrogen or phosphorous. The ohmic contact layer 22 may comprise a metal that forms an ohmic contact to n-type silicon carbide so as to form an ohmic contact to the silicon carbide substrate 24. The substrate 24 may comprise, for example, an n+ silicon carbide wafer. The p-type blocking junction 40 may be a p-type implanted region in an upper portion of the drift region 30 that is heavily implanted with p-type dopants. The channel region 46 is positioned adjacent the p-type blocking junction 40. The channel region 46 is a semiconductor structure that passes current in the on-state and blocks voltage in the blocking state. Current flows through the channel region 46 when the diode 10 is in its forward on-state.

The drift region 30 may comprise a silicon carbide semiconductor region that includes an n-type pillar 32 and a p-type pillar 34. The n-type pillar 32 and the p-type pillar 34 may each comprise epitaxially grown silicon carbide layers that are doped with n-type and p-type dopants, respectively, via ion implantation. The number of charges in the n-type pillar 32 may be approximately equal to the number of charges in the p-type pillar 34.

SUMMARY

Pursuant to embodiments of the present invention, semiconductor devices are provided that include a drift region, a first contact on an upper surface of the drift region and a second contact on a lower surface of the drift region. The drift region includes a first semiconductor pillar that has a tapered sidewall and that is doped with first conductivity type impurities and a second semiconductor pillar on the tapered sidewall of the first semiconductor pillar, the second semiconductor pillar doped with second conductivity type impurities that have an opposite conductivity from the first conductivity type impurities.

In some embodiments, the semiconductor device may further include a third semiconductor pillar on the second semiconductor pillar, the third semiconductor pillar doped with first conductivity type impurities. The third semiconductor pillar may, for example, have a doping concentration of the first conductivity type impurities that is at least fifty times lower than the doping concentration of the first conductivity type impurities in the first semiconductor pillar. The first through third semiconductor pillars may be charge balanced such that the charges in the first and third semiconductor pillars approximately equal the charges in the second semiconductor pillar.

In some embodiments, the drift region may be formed on a semiconductor substrate. The substrate may be between the lower surface of the drift region and the second contact. The tapered sidewall may form an angle of at least 100 degrees with respect to an upper surface of the substrate. The semiconductor substrate may be, for example, a 4H silicon carbide substrate. In such embodiments, the first semiconductor pillar and the second semiconductor pillar may each be silicon carbide pillars. A lower surface of the third semiconductor pillar may directly contact an upper surface of the substrate. An axis that is normal to an upper surface of the substrate that penetrates the tapered sidewall of the first semiconductor pillar may also penetrate an upper portion of the third semiconductor pillar. In embodiments that include a 4H silicon carbide substrate, an active region of the semiconductor device may, for example, extend along the <10-10> crystallographic direction of the substrate or may extend in a direction that forms a first oblique angle with the <10-10> crystallographic direction of the substrate and that forms a second oblique angle with respect to the <11-20> crystallographic direction of the substrate.

In some embodiments, the semiconductor device may include an edge termination, and the second semiconductor pillar may be between the first semiconductor pillar and the edge termination. The edge termination may comprise, for example, a plurality of rings in the third semiconductor pillar that are doped with second conductivity type impurities.

In some embodiments, the third semiconductor pillar may surround the first semiconductor pillar, and the second semiconductor pillar may be between the first semiconductor pillar and the third semiconductor pillar. In some embodiments, the third semiconductor pillar may have a doping concentration of the first conductivity type impurities that is at least fifty times lower than the doping concentration of the first conductivity type impurities in the first semiconductor pillar. In other embodiments, the first semiconductor pillar may have a doping concentration of the first conductivity type impurities that is at least fifty times lower than the doping concentration of the first conductivity type impurities in the third semiconductor pillar. A width of the first semiconductor pillar may, in some embodiments, be at least three times a width of the second semiconductor pillar.

Pursuant to further embodiments of the present invention, semiconductor devices are provided that include a drift region having an upper surface and a lower surface, a first contact on the upper surface of the drift region, and a second contact on the lower surface of the drift region. The drift region of these devices includes a first semiconductor pillar that is doped with first conductivity type impurities and a second semiconductor pillar that is doped with first conductivity type impurities on the first semiconductor pillar. The second semiconductor pillar has a doping concentration of the first conductivity type impurities that is at least fifty times lower than the doping concentration of the first conductivity type impurities in the first semiconductor pillar.

In some embodiments. the semiconductor device further includes a third semiconductor pillar between the first semiconductor pillar and the second semiconductor pillar. This third semiconductor pillar may be doped with second conductivity type impurities that have an opposite conductivity from the first conductivity type impurities. The first through third semiconductor pillars may form a superjunction structure.

In some embodiments, the first through third semiconductor pillars may be on an upper surface of a substrate, and the third semiconductor pillar may have a tapered sidewall so that it forms an oblique angle with the upper surface of the substrate. This oblique angle may be, for example, less than eighty degrees or greater than 100 degrees. The drift region may be at least 5 microns thick in some embodiments. The first through third semiconductor pillars may be charge balanced such that the charges in the first and second semiconductor pillars approximately equal the charges in the third semiconductor pillar. The third semiconductor pillar may, for example, surround the first semiconductor pillar.

In some embodiments, the drift region is on a 4H silicon carbide substrate, and the first semiconductor pillar and the second semiconductor pillar each comprise silicon carbide pillars. In such embodiments, an active region of the semiconductor device may extend along the <10-10> crystallographic direction of the substrate or in a direction that forms a first oblique angle with the <10-10> crystallographic direction of the substrate and that forms a second oblique angle with respect to the <11-20> crystallographic direction of the substrate.

In some embodiments, the semiconductor device may include an edge termination, and the third semiconductor pillar may be between the first semiconductor pillar and the edge termination. The second semiconductor pillar may have a doping concentration of the first conductivity type impurities that is at least fifty times lower than the doping concentration of the first conductivity type impurities in the first semiconductor pillar. Alternatively, the first semiconductor pillar may have a doping concentration of the first conductivity type impurities that is at least fifty times lower than the doping concentration of the first conductivity type impurities in the second semiconductor pillar In some embodiments, an axis that is normal to the upper surface of the substrate may penetrate both the tapered sidewall of the first semiconductor pillar and an upper portion of the second semiconductor pillar.

Pursuant to still further embodiments of the present invention, methods of forming a power semiconductor device are provided in which a semiconductor drift layer that is doped with impurities having a first conductivity type is formed on a semiconductor substrate. A portion of the semiconductor drift layer is then removed to form a recessed region in the semiconductor drift layer and to define a first semiconductor pillar. Impurities having a second conductivity type that is opposite the first conductivity type are implanted into a first sidewall of the semiconductor drift layer that is exposed by the recessed region to convert a portion of the first semiconductor pillar into a second semiconductor pillar. A third semiconductor pillar may then be formed by forming a semiconductor layer in the recessed region.

In some embodiments, the first sidewall may be tapered by an angle of at least 5 degrees with respect to a bottom surface of the semiconductor drift layer. The first semiconductor pillar may have a doping concentration of the first conductivity type impurities that is at least fifty times greater than the doping concentration of the first conductivity type impurities in the third semiconductor pillar or that is at least fifty times less than the doping concentration of the first conductivity type impurities in the third semiconductor pillar. The first through third semiconductor pillars may comprise silicon carbide pillars that together form a superjunction-type drift region of the power semiconductor device.

In some embodiments, the first semiconductor pillar may include an active or passive semiconductor structure (herein a "channel" or a "channel region") that passes current in the on-state and blocks voltage in the blocking state. The first semiconductor pillar may, in some embodiments, have a concentration of the impurities having a first conductivity type of at least $1 \times 10^{15}/cm^3$. In other embodiments, the first semiconductor pillar may have a higher concentration of the impurities having the first conductivity type (e.g., at least $1 \times 10^{15}/cm^3$), while in other embodiments concentrations of lower $1 \times 10^{14}/cm^3$ may be used. The second semiconductor pillar may surround the first semiconductor pillar, and charges in the second semiconductor pillar may approximately balance charges in the first semiconductor pillar. The impurities having the second conductivity type that are implanted into the exposed first sidewall of the semiconductor drift layer may be implanted along an axis that forms an oblique angle with a top surface of the semiconductor substrate. The impurities having the second conductivity type may be implanted into the exposed first sidewall of the semiconductor drift layer at an oblique angle.

Pursuant to still further embodiments, semiconductor devices are provided that have a drift region having an upper portion and a lower portion; a first contact on the upper portion of the drift region; and a second contact on the lower portion of the drift region. In these devices, the drift region includes a first semiconductor pillar that has a tapered sidewall, a second semiconductor pillar on the tapered sidewall of the first semiconductor pillar, and a third semiconductor pillar on the second semiconductor pillar.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
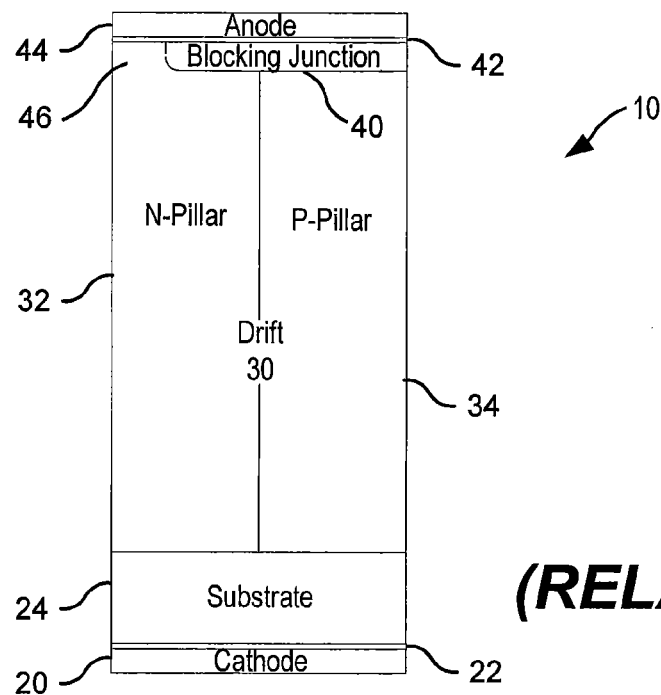
FIG. 1 is a schematic cross-sectional diagram of a conventional power semiconductor device that has a superjunction-type drift region.

Conventional power semiconductor devices having superjunction-type drift regions may be formed in two different ways. First, the drift region may be epitaxially grown on the substrate and then n-type and p-type dopants may be selectively implanted into the drift region to form the respective n-type and p-type pillars. The implanted dopants may be diffused throughout the pillars via, for example, thermal annealing. If necessary, multiple epitaxial growth and ion implantation steps may be performed to form a superjunction-type drift region having a desired thickness. In a second approach, a drift region of a first conductivity type (e.g., n-type) may be epitaxially grown on a substrate, and then an etching step may be performed to form a trench in the epitaxial layer at a location where a pillar having the second conductivity type is to be formed. The sidewall of the trench may then be oxidized, and the trench may then be refilled with the semiconductor material that forms the drift region that is doped with impurities having the second conductivity type. Either approach may be used to form superjunction-type drift regions in, for example, silicon power devices. As will be apparent from the discussion that follows, the semiconductor pillars that are used to form superjunction-type drift regions are regions which extend from a bottom of the drift region to a top of the drift region and can have a variety of different shapes.

It has been discovered that the above techniques may not be very well-suited for forming superjunction-type drift regions in other semiconductor materials such as, for example, silicon carbide. For example, the first conventional fabrication method that is discussed above may not work well in silicon carbide because n-type and p-type dopants do not tend to diffuse well in silicon carbide, even at high temperatures. This is also true in various other compound semiconductor materials such as gallium nitride based semiconductor materials, which dissociate before thermal diffusion can occur. As such, even if large implantation energies are used in the ion implantation process (which may have disadvantages in terms of manufacturing costs and damage to the semiconductor material), a very large number of successive epitaxial growth steps followed by ion implantation may be necessary to obtain breakdown voltages on the order of several kilovolts given the thickness of drift layers of such devices. Such large numbers of growth and implantation steps may be impractical for large scale manufacturing operations.

The second of the above-described conventional techniques, namely forming a trench in the drift region that is refilled with semiconductor material of the second conductivity type, may also be problematic in silicon carbide and certain other compound semiconductor materials because the breakdown voltage of the oxide layer that is formed between the n-type and p-type pillars is about the same as the breakdown voltage for silicon carbide. As a result, during reverse bias operation, tunneling into the oxide layer may occur that can result in leakage currents through the oxide or even destructive avalanche breakdown. Additionally, in silicon carbide non-uniform incorporation of the second conductivity type dopants may occur in the vicinity of the trench sidewalls during the epitaxial trench refill step, which may make it difficult to control the charge of the second conductivity type pillar.

Pursuant to embodiments of the present invention, power semiconductor devices are provided that have superjunction-type drift regions which may overcome difficulties that may arise when attempting to form superjunction structures in silicon carbide or various other compound semiconductor materials. In some embodiments, the superjunction-type drift region may include a first semiconductor pillar that is doped with first conductivity type impurities that has a tapered sidewall that is doped with opposite conductivity type impurities. As used herein, a pillar that has a "tapered sidewall" refers to a pillar having a sidewall that at least a portion of which extends at an oblique angle with respect to a bottom surface of the pillar. The portion of the tapered sidewall that is doped with opposite conductivity impurities may act as a second semiconductor pillar that may, for example, balance the charges in the first semiconductor pillar. By doping the first and second semiconductor pillars so that the product of the width of each pillar times the charge density in each pillar is equal, a relatively uniform electric field profile may be obtained in the voltage blocking state, which allows for higher blocking voltages than otherwise could be achieved. Moreover, as both the first and second semiconductor pillars may have relatively heavy doping densities, the on-state resistance of the semiconductor device may be significantly reduced. Thus, the semiconductor devices according to embodiments of the present invention may exhibit higher breakdown voltages than conventional devices while also having lower drift region resistance when the devices are in their "on" state.

Embodiments of the present invention further provide power semiconductor devices having superjunction-type drift regions that include a first semiconductor pillar that is doped with first conductivity type impurities and a second semiconductor pillar that is doped with first conductivity type impurities on the first semiconductor pillar, where the second semiconductor pillar has a doping concentration that is at least fifty times lower than the doping concentration of the first semiconductor pillar. A third semiconductor pillar that is doped with second conductivity impurities may be provided between the first and second semiconductor pillars. In some embodiments, one or more of the first through third semiconductor pillars may have a sidewall that forms an oblique angle with an upper surface of a semiconductor substrate that underlies the drift region.

Example embodiments of the present invention will now be described with reference to the attached drawings.

Figure 2:
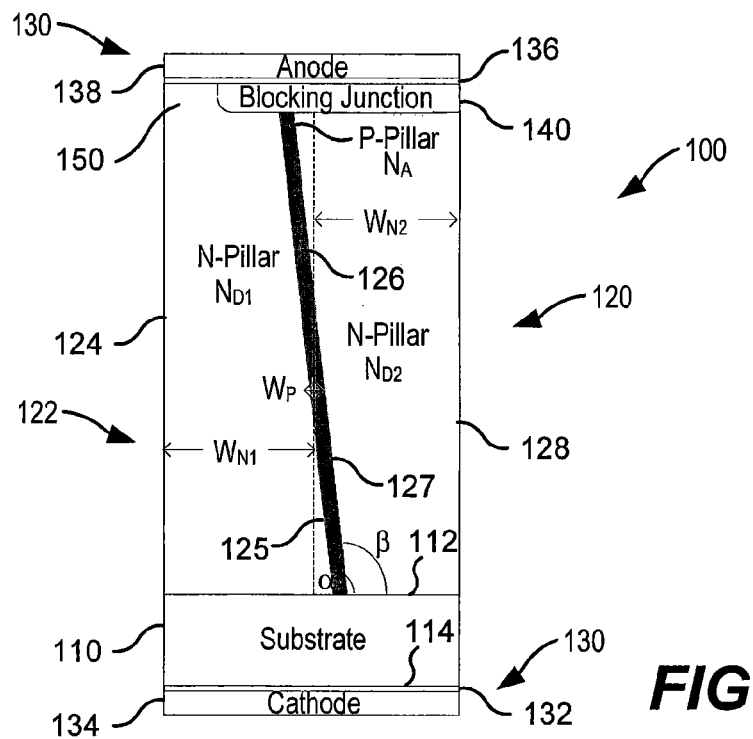
FIG. 2 is a schematic cross-sectional diagram of a power semiconductor device that has a superjunction-type drift region according to embodiments of the present invention.

FIG. 2 is a schematic cross-sectional diagram of a power semiconductor device 100 in the form of a JBS diode that has a superjunction-type drift region according to embodiments of the present invention.

As shown in FIG. 2, the JBS diode 100 includes a substrate 110, a drift region 120 that includes a superjunction structure 122, contact layers 130, a blocking junction 140 and a channel region 150.

The substrate 110 may comprise, for example, a 4H silicon carbide semiconductor wafer that has an upper surface 112 and a lower surface 114. The substrate 110 may be heavily doped with n-type impurities (i.e., an n⁺ silicon carbide substrate). The impurities may comprise, for example, nitrogen or phosphorous. The doping concentration of the substrate 110 may be, for example, between $1 \times 10^{18}$ atoms/cm³ and $1 \times 10^{21}$ atoms/cm³. The substrate 110 may be any appropriate thickness. In example embodiments, the substrate 110 may be between 100 and 500 microns thick.

The drift region 120 may comprise, for example, a silicon carbide drift region 120 that is formed on the upper surface 112 of the substrate 110. In example embodiments, the drift region 120 may be between 5 and 100 microns thick. The drift region 120 includes a superjunction structure 122 that comprises a first n-type silicon carbide pillar 124, a p-type silicon carbide pillar 126 and a second n-type silicon carbide pillar 128. The first n-type silicon carbide pillar 124 may have an outer sidewall 125. In some embodiments, the first sidewall 125 may be tapered (i.e., angled from a vertical plane) with respect to the upper surface 112 of substrate 110. In the depicted embodiment, the outer sidewall 125 and the upper surface 112 of substrate 110 define an obtuse angle α. In some embodiments, the angle α may be at least 95 degrees and less than 120 degrees. Other angles may be used. The first n-type silicon carbide pillar 124 may have an average width of $W_{N1}$ and a charge density $N_{D1}$. The charge density $N_{D1}$ may be substantially uniform throughout the first n-type silicon carbide pillar 124 in some embodiments. The charge density $N_{D1}$ is the number of activated n-type impurities (donors) per unit volume and may be measured as the number of donors/cm³. The charge density $N_{D1}$ may be directly related to the concentration of n-type impurities that are doped into the first n-type silicon carbide pillar 124. In particular, typically only a percentage of the impurities that are doped into a semiconductor pillar (e.g., by doping during growth or by ion implantation) may become activated impurities (i.e., charges). The percentage of dopant impurities that become activated may be generally estimated by a variety of known techniques.

The p-type silicon carbide pillar 126 may directly abut the outer sidewall 125 of the first n-type silicon carbide pillar 124. Consequently, if the sidewall 125 of the first n-type silicon carbide pillar 124 is tapered, then the p-type silicon carbide pillar 126 may also be tapered with respect to the upper surface 112 of substrate 110. The p-type silicon carbide pillar 126 may have a relatively constant width $W_P$. Thus, if the sidewall 125 of the first n-type silicon carbide pillar 124 is tapered, then an outer sidewall 127 of the p-type silicon carbide pillar 126 may also be tapered to form an angle β with respect to the upper surface 112 of the substrate 110. The angle β may be the same as the angle α. The p-type silicon carbide pillar 126 may have a substantially uniform charge density of $N_A$. The charge density $N_A$ is the number of activated p-type impurities (acceptors) per unit volume and may be measured as the number of acceptors/cm³. The width $W_P$ of the p-type silicon carbide pillar 126 may be substantially smaller than the width $W_N$ of the first n-type silicon carbide pillar 124.

The second n-type silicon carbide pillar 128 may directly abut the outer sidewall 127 of the p-type silicon carbide pillar 126. Consequently, the inner sidewall of the second n-type silicon carbide pillar 128 may also be tapered with respect to the upper surface 112 of substrate 110. The second n-type silicon carbide pillar 128 may have an average width of $W_{N2}$ and a substantially uniform charge density of $N_{D2}$. The charge density $N_{D2}$ may be substantially less than the charge density $N_{D1}$. For example, in some embodiments, the charge density $N_{D2}$ may be at least 50 times smaller than the charge density $N_{D1}$. In other embodiments, the charge density $N_{D2}$ may be at least 100 times (two orders of magnitude) or more smaller than the charge density $N_{D1}$. In still other embodiments, the charge density $N_{D2}$ may be three to four orders of magnitude smaller than the charge density $N_{D1}$. The sidewall 125 of the first n-type silicon carbide pillar 124 may directly contact the p-type silicon carbide pillar 126 and the sidewall 127 of the p-type silicon carbide pillar 126 may directly contact the second n-type silicon carbide pillar 128.

In order to achieve charge balance, the semiconductor device 100 may be doped so that:

$$(N_{D1}*W_{N1})+(N_{D2}*W_{N2})=(N_A*W_P) \quad (1)$$

Equation (1) assumes that (a) the heights of the pillars 124, 126, 128 are substantially equal, (b) that the lengths of the pillars 124, 126, 128 are substantially equal and (c) that each pillar has a relatively constant charge density. If these conditions are not net, Equation (1) may be modified accordingly. As noted above, $N_{D2}$ may be much lower than $N_{D1}$ (e.g., 3-4 orders of magnitude lower), while $W_{N1}$ may be approximately equal to $W_{N2}$. For example, in a typical device, the first n-type silicon carbide pillar 124 may be doped with n-type impurities to a concentration of $1\times10^{17}$, the p-type silicon carbide pillar 126 may be doped with p-type impurities to a concentration of $1\times10^{19}$, and the second n-type silicon carbide pillar 128 may be doped with n-type impurities to a concentration of $1\times10^{13}$ or $1\times10^{14}$. If the second n-type silicon carbide pillar 128 has a much lower charge density $N_{D2}$ as compared to the charge density $N_{D1}$ of the first n-type silicon carbide pillar 124, and $W_{N1}$ and $W_{N2}$ are relatively equal, then Equation (1) effectively simplifies to:

$$N_{D1}*W_{N1}=N_A*W_P \quad (2)$$

Referring again to FIG. 2, the contact layers 130 include an ohmic contact layer 132 that is on the bottom surface 114 of the substrate 110, a cathode contact 134 that is on the ohmic contact layer 132, a Schottky contact layer 136 that is on a top surface of the drift region 120, and an anode contact 138 that is on the Schottky contact layer 136. The ohmic contact layer 132 may comprise a material that forms an ohmic contact to the substrate 110. For example, if the substrate 110 comprises a heavily doped n-type silicon carbide substrate 110, the ohmic contact layer 132 may comprise a silicon/cobalt layer. The cathode contact 134 may comprise a highly conductive metal contact such as a silver layer. In some embodiments, the cathode contact 134 may comprise a multilayer metal structure such as, for example, a Ti/Ni/Ag structure. It will be appreciated that in some embodiments the substrate 110 may be removed prior to formation of the ohmic contact layer 132 and the cathode contact 134.

The Schottky contact layer 136 may comprise a conductive layer that forms a Schottky contact with the silicon carbide drift region 120. In some embodiments, the Schottky contact layer 136 may comprise a nickel layer. The anode contact 138 may comprise a highly conductive metal contact such as an aluminum layer.

The blocking junction 140 may comprise a highly doped p-type region in an upper portion of the drift region 120. As shown in FIG. 2, in some embodiments, the blocking junction 140 may substantially or completely cover a top surface of the second n-type silicon carbide pillar 128 and may substantially or completely cover a top surface of the p-type silicon carbide pillar 126. The blocking junction 140 may also partially cover a top surface of the first n-type silicon carbide pillar 124. The blocking junction 140 may reduce the electric field to help shield the Schottky contact 136 from the electric field when the device 100 operates in the blocking state. This reduction in the electric field can be seen in FIGS. 9A-9B which are discussed below. A channel 150 may be provided between the first n-type silicon carbide pillar 124 and the Schottky contact 136. Current flows through the channel 150 when the JBS diode 100 is in its on-state. The blocking junction may incorporate, for example, a MOSFET, JFET, BJT, or thyristor type structure to allow controllable flow of current through the device.

The superjunction-type drift region 120 may be designed to be charge balanced between the alternating n-type and p-type pillars. In some embodiments, the number of charges in the p-type silicon carbide pillar 126 may be equal to the sum of the charges in the first n-type silicon carbide pillar 124 and the charges in the second n-type silicon carbide pillar 128. The number of charges in each pillar 124, 126, 128 is a function of the density of the charges in each region and the volume of each pillar region 124, 126, 128. As the p-type silicon carbide pillar 126 may be much smaller than the first and second n-type silicon carbide pillars 124, 128, the charge density $N_A$ in the p-type silicon carbide pillar 126 may exceed the density of charges $N_{D1}$, $N_{D2}$ in both the first n-type silicon carbide pillar 124 and the second n-type silicon carbide 128.

As noted above, in some embodiments, the second n-type silicon carbide pillar 128 may be a lightly-doped n-type silicon carbide region. For example, the second n-type silicon carbide pillar 128 may have an impurity concentration (and hence a charge density) that is two to three orders of magnitude, or more, less than the impurity concentration of the first n-type silicon carbide pillar 124. In such embodiments, the number of charges in the first n-type silicon carbide pillar 124 may be approximately equal to the number of charges in the p-type silicon carbide pillar 126.

Thus, charge balance may be achieved in the drift region 120 by controlling the widths and charge densities of the silicon carbide pillars 124, 126, 128. By designing the number of charges in the p-type pillar 126 to be substantially equal to the number of charges in the first and second n-type pillars 124, 128, the electric field profile in the drift region 120 of diode 100 may be relatively uniform when the diode 100 is in its blocking state, allowing the diode 100 to block substantially higher voltages than would be possible if the diode 100 instead had a standard n-type drift region structure. It should be noted that exact charge balance is not required and likely could not be consistently achieved. However, even approximate charge balance may provide a much more uniform electric field profile and a resultant reduction in leakage current. Moreover, because the first n-type silicon carbide drift region 124, which is the portion of the drift region 120 that is under the channel 150, has a high dopant impurity concentration as compared to conventional devices that are designed to block similar voltage levels, the on-state resistance of the JBS diode 100 may be reduced substantially.

As noted above, conventional methods of forming superconductor-type drift regions that are used in silicon may not be commercially practical in silicon carbide and various other semiconductor materials. For example, the first conventional fabrication method uses thermal annealing to diffuse dopants throughout one or both conductivity-type pillars; however, such a technique may not work well in silicon carbide because n-type and p-type dopants do not tend to diffuse well in 4H silicon carbide, even at high temperatures. As a result, dopant impurities that are incorporated into silicon carbide by ion implantation cannot be readily spread out in either the horizontal or vertical direction by diffusion (e.g., diffusion at elevated temperatures). In fact, even if MeV-scale ion implantation energies are used in order to more deeply implant the dopants, many epitaxial growth and ion implantation cycles would be required to grow the drift region to a sufficient thickness to support kilovolt scale blocking voltages. Use of such high energy ion implantation increases manufacturing costs and may cause increased damage to the implanted layers. Thus, forming a superconductor-type drift region in a silicon carbide power device may not be commercially practical using the conventional grow and implant technique.

The second conventional technique for forming a superconductor-type drift region is to grow an epitaxial layer that is doped during growth with first conductivity type impurities and to then remove a portion of this epitaxial layer via etching to form a recess in the epitaxial layer. Then, a sidewall of the remaining epitaxial material may be oxidized, and semiconductor material that is doped with opposite conductivity type impurities is formed in the recessed region. This fabrication method may also not work well in silicon carbide because the breakdown voltage of the oxide layer is about the same as the breakdown voltage for silicon carbide. As a result, during reverse bias operation, tunneling into the oxide layer may occur that can result in leakage currents through the oxide or even destructive avalanche breakdown. Additionally, non-uniform incorporation of the second conductivity type dopants may occur in the vicinity of the trench sidewalls during the epitaxial trench refill step, which may make it difficult to control the charge of the second conductivity type pillar.

Pursuant to embodiments of the present invention, power semiconductor devices are provided that have modified superconductor-type drift regions that may allow commercial production of such devices in silicon carbide and other semiconductor materials. Similar to the second conventional technique described above, in embodiments of the present invention, an epitaxial layer that is doped during growth with first conductivity type impurities is grown on a substrate and a portion thereof is then removed via, for example, etching to form a trench or other recess in the epitaxial layer so that the epitaxial layer may be converted into a first semiconductor pillar. Second conductivity type impurities are then implanted into a sidewall of the first semiconductor pillar to form a second semiconductor pillar. As the second conductivity impurities may not be implanted deeply into the sidewall, they may be implanted at a high concentration as compared to the first conductivity type impurities that are implanted in the first semiconductor pillar. A third semiconductor pillar may be formed that fills the trench or other recess. The third semiconductor pillar may, for example, be lightly doped with the first conductivity type impurities.

Figure 3:
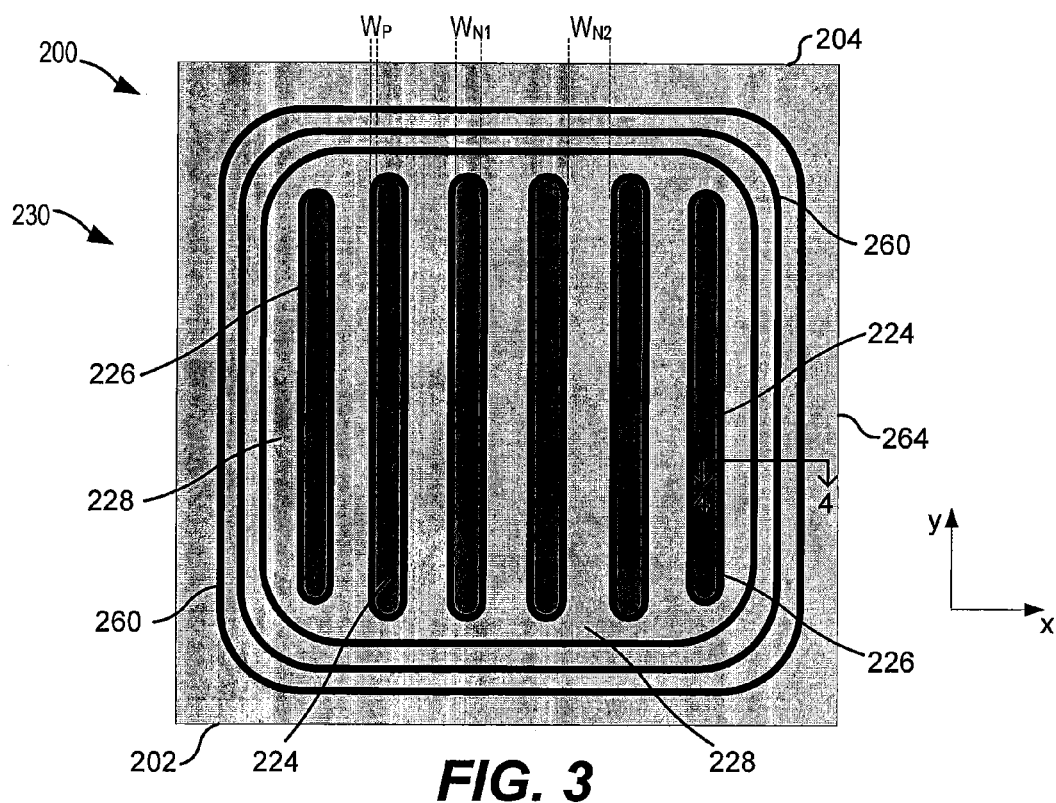
FIG. 3 is a schematic plan view of a power semiconductor device that has a superjunction-type drift region according to embodiments of the present invention.

FIG. 3 is a schematic plan view of a power semiconductor device 200 that has a superjunction-type drift region according to embodiments of the present invention. In FIG. 3, the topside metallization and active structures have been omitted to illustrate the semiconductor pillar structures.

As shown in FIG. 3, the semiconductor device 200 includes a semiconductor drift region 230 that has a plurality of first n-type silicon carbide pillars 224, a plurality of p-type silicon carbide pillars 226, and a plurality of second n-type silicon carbide pillars 228. In the particular embodiment of FIG. 3, each first n-type silicon carbide pillar 224 comprises a bar shaped pillar that extends along a first direction (the y-axis direction) on the top surface of a substrate 210 (shown in FIG. 4). Each p-type silicon carbide pillar 226 surrounds a respective one of the of first n-type silicon carbide pillars 224. As discussed above, the p-type silicon carbide pillars 226 may be formed by selectively etching an n-type silicon carbide layer that is formed on the substrate to form the first n-type silicon carbide pillars 224 and then implanting a heavy dosage of p-type impurities into the exposed sidewalls of the first n-type silicon carbide pillars 224 to convert the sidewall regions thereof into the p-type silicon carbide pillars 226.

Once the p-type silicon carbide pillars 226 are formed, a second silicon carbide layer may be formed on the substrate 210. This second silicon carbide layer may be formed, for example, via epitaxial growth. In some embodiments, the second silicon carbide layer may be lightly doped with n-type impurities. Once the second silicon carbide layer is grown, a planarization process (e.g., chemical mechanical polishing) may be performed to convert the second silicon carbide layer into the second n-type silicon carbide pillars 228. As shown in FIG. 3, the second n-type silicon carbide pillars 228 may be bar shaped and may extend in the y-axis direction between adjacent ones of the first n-type silicon carbide pillars 224. In the depicted embodiment, the second n-type silicon carbide pillars 228 are connected to each other in the x-direction at opposed first and second sides 202, 204 of the device, and hence the second n-type silicon carbide pillars 228 form a continuous pattern on the substrate 210.

As is also shown in FIG. 3, a plurality of guard rings 260 surround the first n-type silicon carbide pillars 224 and the p-type silicon carbide pillars 226. The guard rings 260 may comprise edge termination structures. As known to those of skill in the art, when power semiconductor devices are operated in the blocking state, leakage currents may begin to flow at the edges of the active region as the voltage is increased. Leakage currents tend to flow in these edge regions because electric field crowding effects at the edge of the device may result in increased electric fields in these regions. As noted above, if the voltage on the device is increased past the breakdown voltage to a critical level, the increasing electric field may result in runaway generation of charge carriers within the semiconductor device, leading to a condition known as avalanche breakdown. When avalanche breakdown occurs, the current increases sharply and may become uncontrollable, and an avalanche breakdown event may damage or destroy the semiconductor device.

Figure 4:
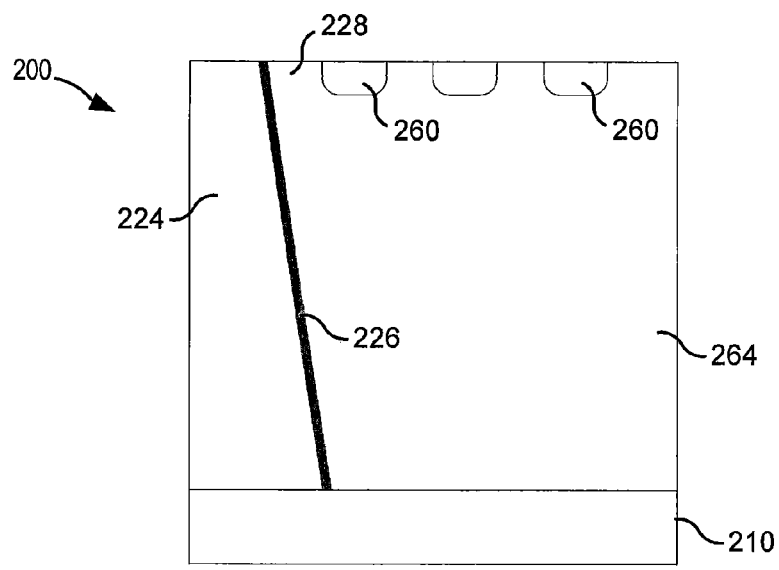
FIG. 4 is a schematic cross-sectional diagram of an edge termination portion of the power semiconductor device of FIG. 3.

In order to reduce this electric field crowding (and the resulting increased leakage currents), edge termination structures such as the guard rings 260 may be provided that surround part or all of the active region of a power semiconductor device. These edge termination structures may be designed to spread the electric field out over a greater area, thereby reducing the electric field crowding. Guard rings are one known type of edge termination structure. As shown in FIG. 4, which is a cross-sectional diagram taken along line 4-4 of FIG. 3, the guard rings 260 may comprise spaced-apart p-type trenches 260 that are formed in an upper region of an n-type silicon carbide epitaxial layer 264 that surrounds the active region of the semiconductor device 200. The n-type silicon carbide epitaxial layer may be part of the same epitaxial layer that forms the second n-type silicon carbide pillars 228, and may simply be an extension of those pillars 228 that surrounds the active region. While FIGS. 3 and 4 illustrate a power semiconductor device 200 that uses several guard rings 260 as an edge termination structure, it will be appreciated that any appropriate edge termination structure may be used. For example, in other embodiments, the guard rings 260 may be replaced with a junction termination extension. It will also be appreciated that the edge termination structure may be omitted in some embodiments.

Figure 5:
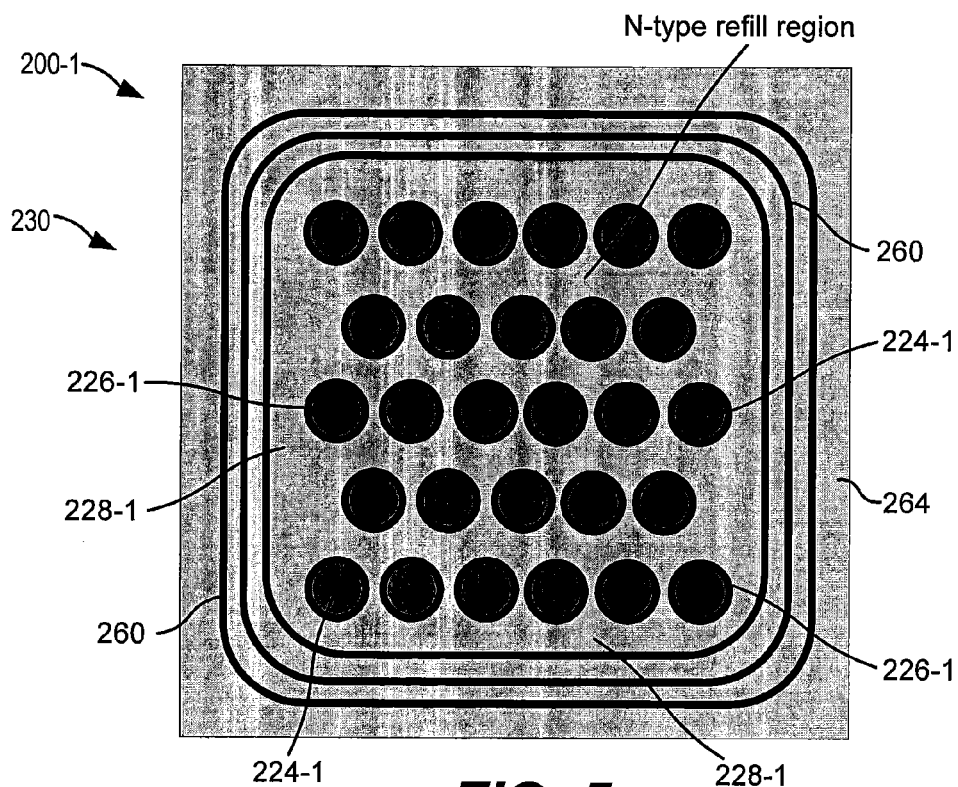
FIG. 5 is a schematic plan view of a power semiconductor device that has a superjunction-type drift region according to further embodiments of the present invention.

FIG. 5 is a schematic plan view of a power semiconductor device 200-1 that has a superjunction-type drift region according to further embodiments of the present invention. As with FIG. 3, in FIG. 5, the topside metallization and active structures have been omitted to illustrate the semiconductor pillar structures. As shown in FIG. 5 the semiconductor device 200-1 is very similar to the semiconductor device 200 of FIGS. 3-4, except that the first n-type silicon carbide pillars 224 of the device of FIGS. 3-4 are replaced with first n-type silicon carbide pillars 224-1 that are cylindrical pillar structures that extend upwardly from the substrate instead of bar-shaped pillars as in the embodiment of FIGS. 3-4. Because of this change to the first n-type silicon carbide pillars 224-1, the p-type silicon carbide pillars 226-1 in device 200-1 have an annular horizontal cross-section (i.e., a cross-section taken along a plane parallel to a top surface of the substrate). The second n-type silicon pillars 228-1 of the power semiconductor device 200-1 surround the p-type silicon pillars 226-1, and may be a continuous structure such that the boundaries between adjacent pillars 228-1 are not particularly clear. In the present application, the region labeled "n-type refill region" in FIG. 5 is considered to comprise a plurality of n-type silicon carbide pillars 228-1 even though the boundaries between adjacent pillars are not well-defined. The superjunction structure comprising the silicon carbide pillars 224-1, 226-1, 228-1 in the power semiconductor device 200-1 may operate in the same fashion as the power semiconductor devices of FIGS. 2-4, and hence further discussion of power semiconductor device 200-1 will be omitted.

Figure 6:
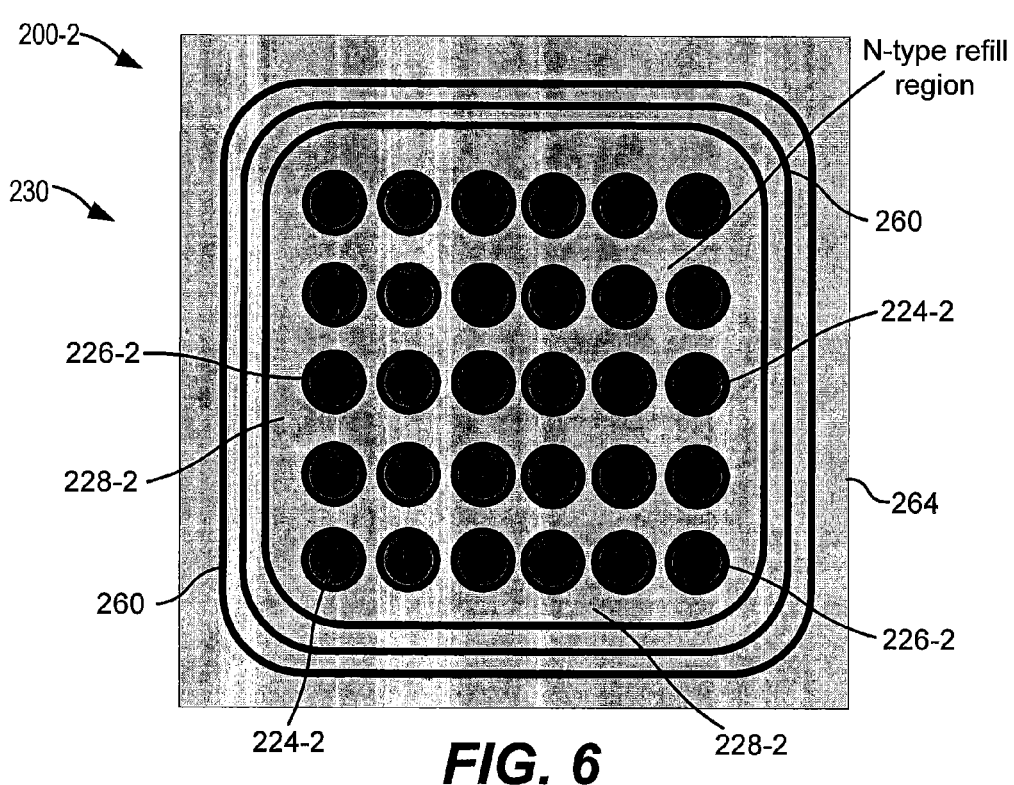
FIG. 6 is a schematic plan view of a power semiconductor device that has a superjunction-type drift region according to still further embodiments of the present invention.

FIG. 6 is a schematic plan view of a power semiconductor device 200-2 that has a superjunction-type drift region according to still further embodiments of the present invention. As with the embodiments of FIGS. 3 and 5, in FIG. 6 the topside metallization and active structures have been omitted to illustrate the semiconductor pillar structures.

As shown in FIG. 6 the semiconductor device 200-2 is very similar to the semiconductor device 200-1 of FIG. 5, except that the first n-type silicon carbide pillars 224-2 in the device 200-2 of FIG. 6 are arranged in rows and columns as opposed to the offset row/column approach in the embodiment of FIG. 5. The p-type silicon carbide pillars 226-2 and the second n-type silicon carbide pillars 228-2 in the device 200-2 are modified accordingly to surround the first n-type silicon pillars 224-2. The superjunction structure comprising the silicon carbide pillars 224-2, 226-2, 228-2 in the power semiconductor device 200-2 may operate in the same fashion as the power semiconductor devices of FIGS. 2-4, and hence further discussion of power semiconductor device 200-2 will be omitted.

Figure 7:
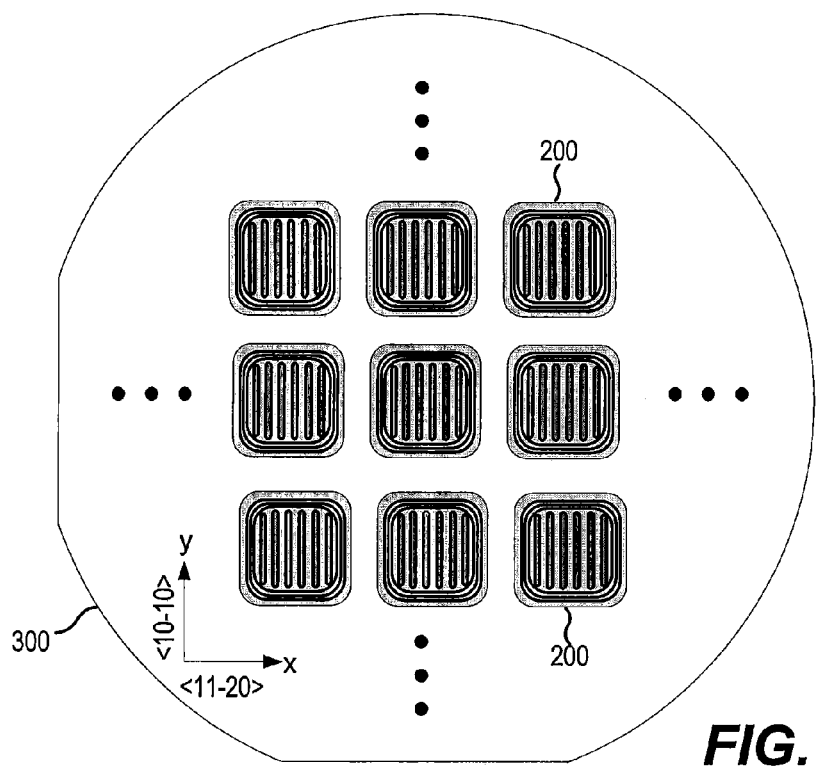
FIG. 7 is a schematic plan view of a semiconductor wafer that has a plurality of power semiconductor devices according to embodiments of the invention formed thereon.

FIG. 7 is a schematic plan view of a semiconductor wafer 300 that has a plurality of power semiconductor devices 200 according to embodiments of the invention formed thereon. The semiconductor wafer 300 may comprise, for example, a 4H silicon carbide wafer. The semiconductor devices 200 may, for example, be formed in rows and columns on the wafer 300. The wafer 300 may be cut from a boule of material so that the top surface of the wafer 300 is along a crystallographic plane that extends in the <10-10> crystallographic direction (from top to bottom in the plan view of FIG. 7) and along the <11-20> crystallographic direction (from left to right in the plan view of FIG. 7).

As shown in FIG. 7, the power semiconductor devices 200 can be oriented on the wafer 300 so that the pillars 224, 226 thereof (which in the power semiconductor device 200 are elongated pillars) extend in the y-axis direction and hence are perpendicular to the <11-20> crystallographic direction and extend along the x-axis direction (i.e., the pillars 224, 226 extend parallel to the <10-10> crystallographic direction).

Figure 8:
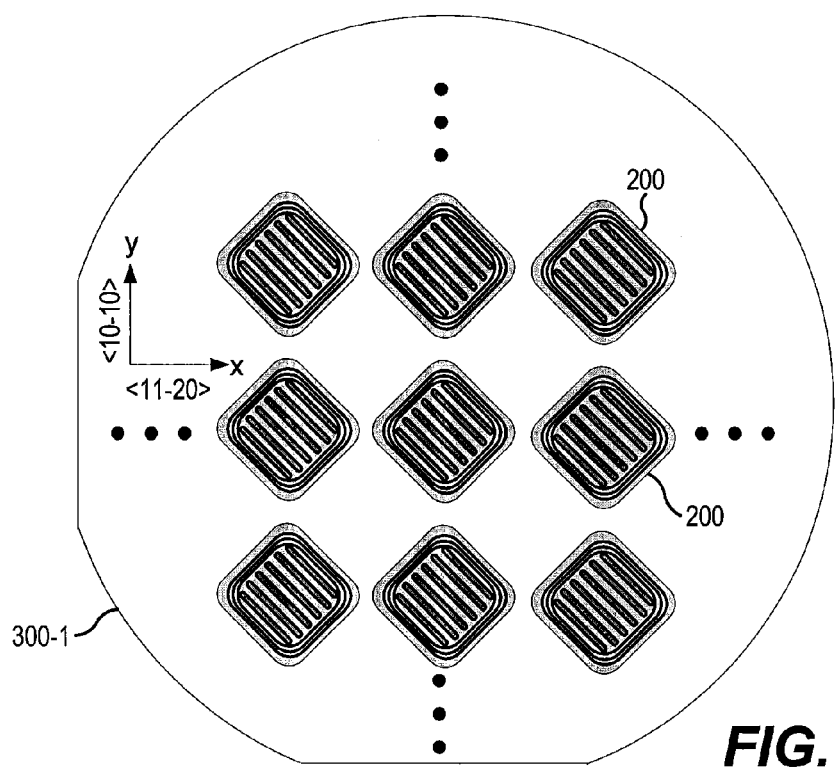
FIG. 8 is a schematic plan view of another semiconductor wafer that has a plurality of power semiconductor devices according to additional embodiments of the invention formed thereon.

FIG. 8 is a schematic plan view of a semiconductor wafer 300-1 that has a plurality of power semiconductor devices 200 according to additional embodiments of the invention formed thereon. The semiconductor wafer 300-1 may comprise, for example, a 4H silicon carbide wafer. The semiconductor devices 200 are, once again, formed in rows and columns on the wafer 300-1. The wafer 300-1 may be cut from a boule of material so that the top surface of the wafer 300-1 is along a crystallographic plane that extends in the <10-10> crystallographic direction (from top to bottom in the plan view of FIG. 8) and along the <11-20> crystallographic direction (from left to right in the plan view of FIG. 8).

The power semiconductor devices 200 can be oriented on the wafer 300-1 so that the pillars 224, 226 thereof (which in the power semiconductor device 200 are elongated pillars) are tilted or angled with respect to both the <11-20> crystallographic direction and the <10-10> crystallographic direction. This can be accomplished via photolithography so that the etching masks are designed to run in a diagonal direction across the wafer 300-1 or, alternatively, the major flat of the wafer 300-1 may be cut so that it is not along the <11-20> crystallographic direction but instead is at an oblique angle to the <11-20> crystallographic direction. Whether or not the trenches etched into the n-type epitaxial layer are aligned along a particular crystallographic direction of the wafer will impact the epitaxial refill process used to form the second n-type silicon carbide pillars 228.

Figure 9A:
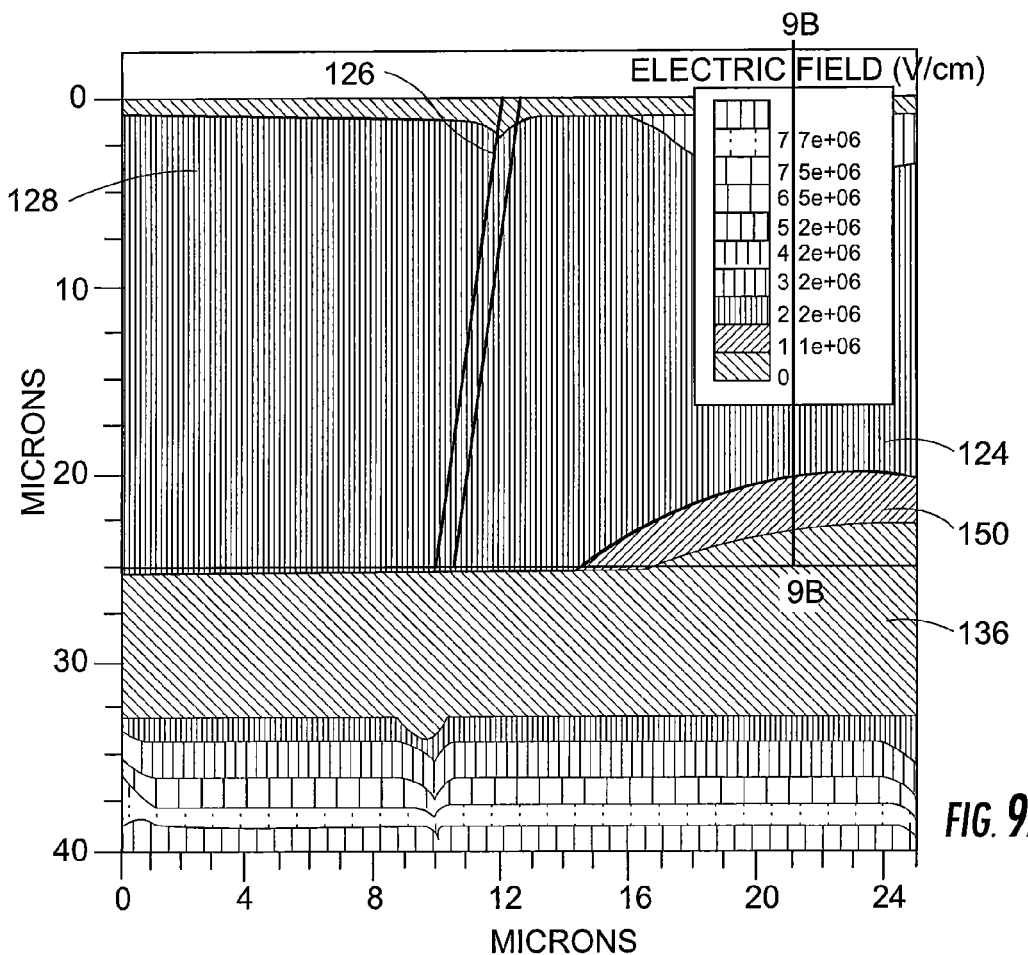
FIGS. 9A and 9B are a schematic cross-sectional diagram and a graph that illustrate the simulated electric field potential of the superjunction structure of a power semiconductor device according to embodiments of the present invention.
Figure 9B:
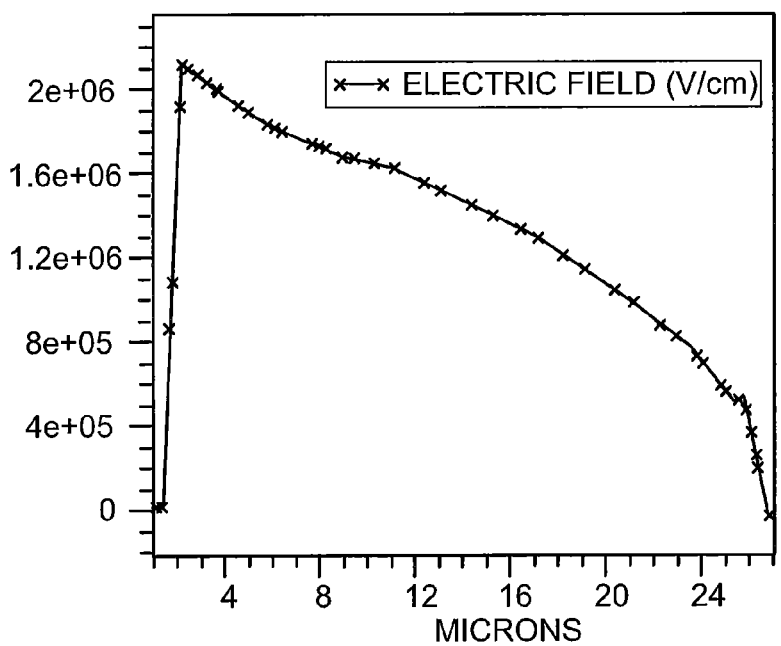

FIGS. 9A and 9B are a schematic cross-sectional diagram and a graph of the simulated electric field potential taken along the center of the n-type pillar of the superjunction structure of a power semiconductor device according to embodiments of the present invention. In FIG. 9A, region 124 comprises the first n-type silicon carbide pillar, region 126 is the p-type silicon carbide pillar, region 128 is the second n-type silicon carbide pillar 128, and region 136 is a Schottky contact layer that was set to have a barrier height between materials of 1.3 eV. In the simulation of FIG. 9A, the drift region 120 was 25 microns thick and had a 24 micron cell pitch. The first n-type silicon carbide pillar 124 has an average width of about 11 microns, the second n-type silicon carbide pillar 128 has an average width of about 12 microns and the p-type silicon carbide pillar 126 has a width of about 1 micron. The doping density of the first n-type silicon carbide pillar 124 is $7.3 \times 10^{15}$ n-type impurities/cm$^3$, which is about three times the doping density of a typical conventional device. A voltage of 3.3 kilovolts was applied in the simulation.

As shown in FIG. 9A, the electric field in the drift region 120 of the device (i.e., in the pillars 124, 126, 128 is relatively constant, although a small decrease in the electric field occurs in the channel region 150. FIG. 9B is a graph that show the simulated electric field as a function of distance from the substrate (in microns) along the line 9B-9B of FIG. 9A. As shown in FIG. 9B, the electric field potential in the silicon carbide drift region differs by about a factor of three (i.e., from about 700,000 V/cm to about 2,100,000 V/cm). This is much more uniform than a conventional power semiconductor device that does not have a superjunction-type drift region. The simulation shows that the device according to embodiments of the present invention will have approximately one-half the on-resistance of a conventional drift structure, namely a resistance of about 13 ohm-cm$^2$ at 150° C. versus an on-resistance of about 25 ohm-cm$^2$ for a conventional drift region. Notably, the simulated device of FIGS. 9A-9B has a relatively large cell pitch and relatively low doping levels. If the cell pitch is reduced and the doping density increased, the reduction in on-resistance will be even more pronounced.

Figure 10A:
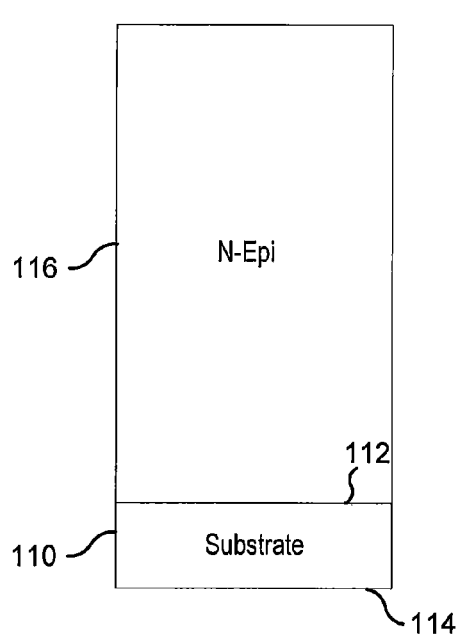
FIGS. 10A-10E are schematic cross-sectional diagrams that illustrate a method of fabricating a power semiconductor device according to embodiments of the present invention.

FIGS. 10A-10E are schematic cross-sectional diagrams that illustrate a method of fabricating a power semiconductor device according to embodiments of the present invention. As shown in FIG. 10A, an n-type silicon carbide layer 116 may be formed on a top surface 112 of a heavily-doped n-type 4H silicon carbide substrate 110. The n-type silicon carbide layer 116 may be, for example, epitaxial grown on the substrate 110. The n-type silicon carbide layer 116 may be doped during growth with n-type impurities to a concentration of, for example, between $1 \times 10^{15}$/cm$^3$ and $1 \times 10^{19}$/cm$^3$.

Figure 10B:
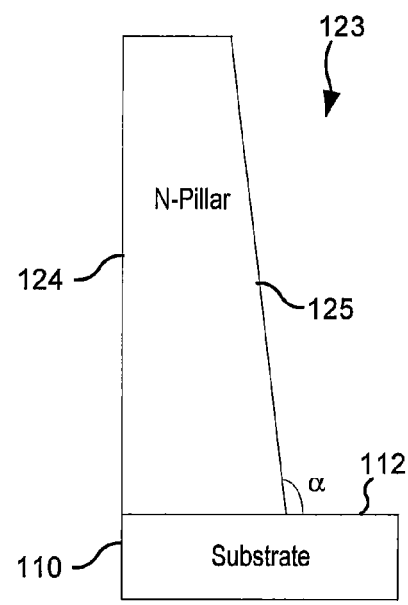

Referring to FIG. 10B, a mask layer (not shown) may be deposited on the n-type silicon carbide layer 116 and this mask layer may then be patterned via, for example, photolithography. The n-type silicon carbide layer 116 may then be etched via, for example, wet and/or dry etching to remove a portion of the n-type silicon carbide layer 116. As shown in FIG. 10B, the n-type silicon carbide layer 116 may be patterned to form a trench 123 that exposes the upper surface 112 of the substrate 110. The patterning of n-type silicon carbide layer 116 may convert the n-type silicon carbide layer 116 into a first n-type silicon carbide pillar 124 that has a sidewall 125. In the depicted embodiment, the sidewall 125 is a tapered sidewall 125. The tapered sidewall 125 may be formed, for example, by performing a partially anisotropic etch. In some embodiments, the tapered sidewall 125 may form an angle α of between about 95 degrees and about 120 degrees with respect to the top surface 112 of the silicon carbide substrate 110. It will be appreciated, however, that sidewalls 125 that form other angles may be used. It will also be appreciated that in some embodiments the first n-type silicon carbide pillar 124 may have a substantially vertical sidewall 125. The use of tapered sidewalls 125 may also reduce the likelihood that voids form during a subsequent epitaxial growth process (described below) that is used to fill the recess 123. In other embodiments, the tapered sidewall 125 may be formed by controlling the plasma conditions of a reactive ion etching step or by transferring a tapered profile to a consumable hard mask such as, for example, a thick photoresist that has been reflowed via heating to produce a tapered angle.

The n-type silicon carbide layer 116 may be etched sufficiently so as to expose the substrate 110. The substrate 110 may be heavily-doped with n-type impurities. For example, the substrate 110 may have a doping concentration that is two orders of magnitude or more greater than the doping density of the n-type silicon carbide layer 116. Given the high doping level of the substrate, the substrate 110 will not turn p-type during a subsequent ion implantation step involving p-type impurities. The ion implantation step may also be performed at an angle (see discussion below) which may help shield the substrate 110 from the p-type impurities.

Figure 10C:
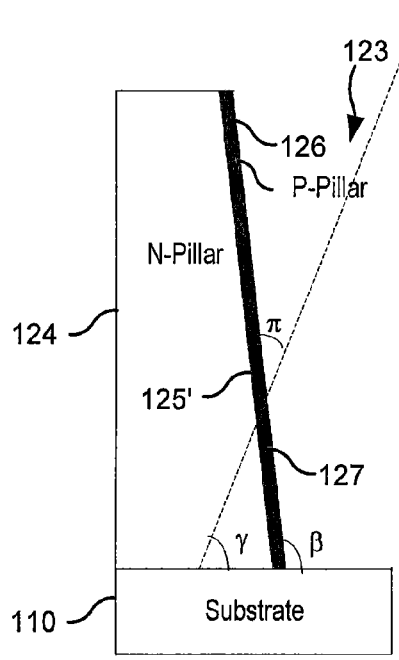

Referring to FIG. 10C, one or more ion implantation processes may be performed to implant p-type impurities into the sidewall 125 of the first n-type silicon carbide pillar 124. The p-type impurities may be, for example, aluminum atoms. The implanted p-type impurities may convert a portion of the first n-type silicon carbide pillar into a p-type silicon carbide pillar 126. The p-type silicon carbide pillar 126 may be more heavily doped than the first n-type silicon carbide pillar 124. For example, the p-type silicon carbide pillar 126 may be doped with p-type impurities to a concentration of, for example, between $1 \times 10^{17}$/cm$^3$ and $1 \times 10^{21}$/cm$^3$. As the p-type silicon carbide pillar 126 is formed by implanting the sidewall of the first n-type silicon carbide pillar 124, an outer sidewall 127 of the p-type silicon carbide pillar 126 may form an oblique angle β with respect to the top surface 112 of the substrate 110. This oblique angle β may be the same as the angle α that the sidewall 125 of the first n-type silicon carbide pillar forms with the top surface 112 of the substrate 110. In some embodiments, the dopant concentration in the p-type silicon carbide pillar 126 may be relatively constant as a function of vertical distance from the substrate 110. Since the p-type silicon carbide pillar 126 is formed in a portion of the first n-type silicon carbide pillar 124, after the p-type silicon carbide pillar 126 is formed the lateral width of the first n-type silicon carbide pillar 124 is reduced since the sidewall 125 shifts inwardly and becomes sidewall 125', as shown in FIGS. 10B and 10C.

In some embodiments, the ion implantation process may vertically implant the ions into the sidewall 125 of the first n-type silicon carbide pillar 124. Such vertical implantation may be most effective when the sidewall 125 is at a steeper angle with respect to the top surface 112 of the substrate 110. In other embodiments, the ions may be implanted at an angle that is offset from the vertical. For example, as shown in FIG. 10C, the ions may be implanted along an axis that forms an acute angle γ with the top surface 112 of the substrate 110. Such angled ion implantation may be particularly beneficial with vertical sidewalls 125 or sidewalls 125 that are only tapered a small amount from a vertical axis bisecting the substrate 110. The aspect ratio of the trench/recess 123 may limit how low the angle g can be set to while still allowing the ion implantation process to implant the full length of the sidewall 125. As is also shown in FIG. 10C, the impurities may be implanted into the sidewall 125 at an oblique angle π.

Figure 10D:
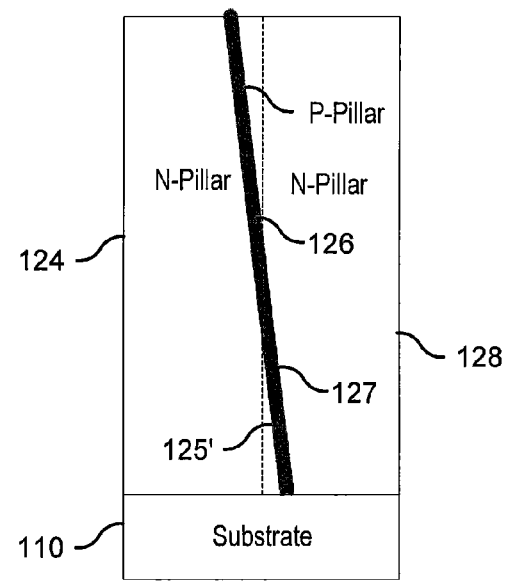

Referring to FIG. 10D, an epitaxial trench refill process may be performed to grow an n-type epitaxial layer (not shown) in the recess formed by the patterning process described above with reference to FIG. 10B. The n-type epitaxial layer may comprise a lightly-doped n-type silicon carbide layer. The n-type epitaxial layer may then be planarized by, for example, a chemical-mechanical polishing process to expose the top surfaces of the first n-type silicon carbide pillar 124 and the p-type silicon carbide pillar 126. This planarization process may convert the n-type epitaxial layer into a second n-type silicon carbide pillar 128. The second n-type silicon carbide pillar 128 may directly contact the exposed sidewall 127 of the p-type silicon carbide pillar 126, and may also directly contact the top surface 112 of the silicon carbide substrate 110. The widths and doping densities of the pillars 124, 126, 128 may be designed so that a semiconductor device that is formed from these pillars 124, 126, 128 may be charge balanced (i.e., the total number of p-type charges may approximately equal the total number of n-type charges) as described above. The recess 123 may be oriented with respect to the substrate 110 in a manner that facilitates growth of a high quality epitaxial layer on the substrate 110.

The first n-type silicon carbide pillar 124, the p-type silicon carbide pillar 126 and the second n-type silicon carbide pillar 128 together form a drift region 120 of the semiconductor device 100 that has a superjunction structure. This superjunction-type drift region 120 may be formed, in some embodiments, in four steps as shown in FIGS. 10A-10D, regardless of the vertical thickness of the drift region 120. If the second n-type silicon carbide pillar 128 is only lightly-doped, then the charge in this region may have little or no impact on the overall charge balance of the superjunction structure. In some embodiments, the second n-type silicon carbide pillar 128 may be an undoped pillar.

Figure 10E:
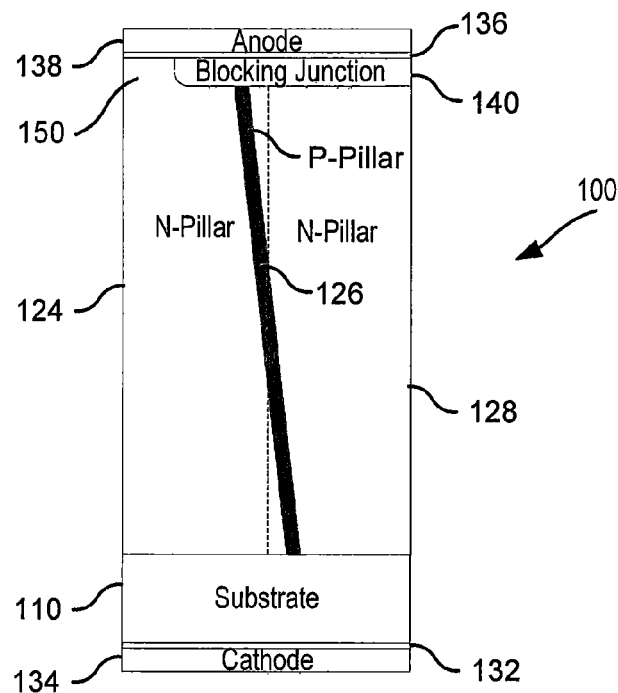

Referring to FIG. 10E, a heavily-doped p-type region may be formed in upper regions of the first n-type silicon carbide pillar 124, the p-type silicon carbide pillar 126 and the second n-type silicon carbide pillar 128 to form a blocking junction 140. The blocking junction 140 defines a channel region 150 in an upper portion of the first n-type silicon carbide pillar 124. When the semiconductor device 100 is in its on state, current will flow through the channel region 150. Contact structures may also be added to the device. As shown in FIG. 10E, the contact structures may include, for example, an ohmic contact layer 132 that is on the bottom surface 114 of the substrate 110, a cathode contact 134 that is on the ohmic contact layer 132, a Schottky contact layer 136 that is on a top surface of the drift region 120, and an anode contact 138 that is on the Schottky contact layer 136.

The device illustrated in FIG. 10E is a JBS diode. However, it will be appreciated that other power semiconductor devices such as, for example, Schottky diodes, MOSFETs, JFETs and other power semiconductor devices may be formed to have superjunction drift regions according to embodiments of the present invention. It will also be appreciated that the superjunction drift regions disclosed herein (and the methods of forming devices including such superjunction drift regions) may also be used with bipolar junction transistors (BJTs), PiN diodes, GTOs, IGBTs, MOS-controlled thyristors or other bipolar semiconductor devices as such devices can, for example, be formed to operate primarily in a unipolar regime.

While not shown in FIG. 10E, edge termination structures such as, for example, guard rings, junction termination extensions, field plates, mesa terminations and the like may also be formed to complete the semiconductor device. The lightly-doped second n-type pillar 128 may allow the electric field to spread quickly in the lateral direction, which may allow a standard guard ring termination to be used. It will also be appreciated that the edge terminations need not be located in the upper surface of the drift region, but may alternatively or additionally be located within center portions (along a vertical axis) of the drift region.

Figure 11:
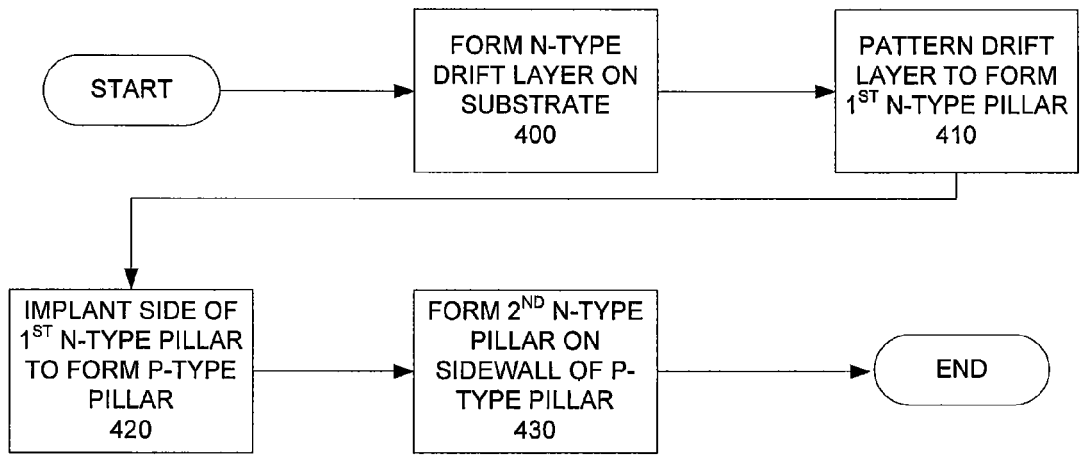
FIG. 11 is a flow chart that illustrates a method of fabricating a power semiconductor device having a superjunction-type drift region according to embodiments of the present invention.

FIG. 11 is a flow chart that illustrates a method of fabricating a power semiconductor device having a superjunction-type drift region according to embodiments of the present invention. As shown in FIG. 11, operations for fabricating the power semiconductor device may begin by forming a first epitaxial layer having first conductivity type impurities on a substrate (block 400). This first epitaxial layer may then be patterned via etching or another patterning process to form a recess therein (block 410). In some cases, the recess may be a trench that exposes an upper surface of the substrate. The patterning process may convert the first epitaxial layer into a first semiconductor pillar that is doped with first conductivity type impurities. In some embodiments, the first epitaxial layer may be patterned in such a way so that a sidewall of the first semiconductor pillar that defines a sidewall of the trench is tapered with respect to the top surface of the semiconductor substrate. Next, impurities having a second conductivity type that is opposite the first conductivity type may be implanted via ion implantation into a sidewall of the first semiconductor pillar to convert a portion of the first semiconductor pillar into a second semiconductor pillar (block 420). Then a second epitaxial layer may be formed that fills the trench and this second epitaxial layer may then be planarized to form a third semiconductor pillar (block 430). Together, the first through third semiconductor pillars may form a superjunction-type drift region for the semiconductor device.

While the above-described embodiments of the present invention first form a heavily-doped n-type semiconductor pillar, then form the p-type pillar, and lastly form a lightly-doped n-type semiconductor pillar in the recess, it will be appreciated that in each of the above described embodiments the first pillar that is formed may be lightly-doped and the third pillar that is formed may be heavily-doped. Thus, for example, in the embodiment of FIG. 2, the first n-type silicon carbide pillar 124 could instead by a very lightly-doped pillar while the second n-type silicon carbide pillar 128 could be more heavily doped. The location of the blocking junction would be changed so that the blocking junction covers the lightly doped pillar and the p-type pillar and perhaps part of the heavily-doped pillar. The same change could be made to each of the embodiments described herein. In embodiments where the lightly-doped pillar is formed first, the taper of the sidewall of the heavily-doped region is reversed (i.e., the heavily doped pillar will now have a greater width adjacent the blocking junction and a smaller width adjacent the substrate, as compared to the embodiment of FIG. 2 where the heavily doped pillar has a smaller width adjacent the blocking junction and a greater width adjacent the substrate). This may be useful for tailoring electric field profiles in the blocking state.

While in the description above, the example embodiments are described with respect to semiconductor devices that have n-type substrates and channels in n-type portions of the drift layers, it will be appreciated that opposite conductivity type devices may be formed by simply reversing the conductivity of the n-type and p-type layers in each of the above embodiments. Thus, it will be appreciated that the present invention covers both n-type and p-type devices.

The power semiconductor devices and methods of forming the same according to embodiments of the present invention may provide a number of advantages as compared to prior art techniques. For example, by forming the p-type pillars in the sidewalls of n-type pillars, p-type pillars may be formed using a single ion implantation step, even when very thick drift regions are used. The semiconductor devices according to embodiments of the present invention may also be formed with, in some cases, as few as two epitaxial growth steps. The resulting devices may block higher voltages and exhibit lower on-state resistance than comparable conventional power semiconductor devices.

The power semiconductor devices according to embodiments of the present invention may be more lightly doped at the edge regions than conventional power semiconductor devices, as the second n-type pillar may be very lightly doped. This may be advantageous as it may allow the use of simpler junction terminations such as guard rings that may not be suitable for use when the edge regions of the device are more heavily doped.

It will be appreciated that many modifications may be made to the example embodiments that are described above and pictured in the attached figures without departing from the scope of the present invention. By way of example, while pillars having example shapes have been shown and described, it will be appreciated that the pillars may have any appropriate shape. Preferably, the n-type and p-type pillars are substantially charge balanced, although it will be appreciated that some mismatch in charge balance may be tolerated while still obtaining some benefits, albeit possibly at reduced levels of performance improvement. It will also be appreciated that the lateral size of the pillars may be selected so that the charges in the n-type and p-type regions sufficiently interact to achieve charge balance. The acceptable distance may be a function of the doping concentration. Typically, the width of the first n-type pillar will be between about 2 microns and about 50 microns, although these numbers may vary depending upon other factors such as the type of the device, the designed blocking voltage and the like. It will also be appreciated that the number of pillars may be modified. For example, multiple alternating n-type and p-type pillars may be provided in some embodiments.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A semiconductor device, comprising:
a drift region having an upper portion and a lower portion;
a first contact on the upper portion of the drift region; and
a second contact on the lower portion of the drift region,
wherein the drift region includes:
  a first semiconductor pillar that has a tapered sidewall and that is doped with first conductivity type impurities; and
  a second semiconductor pillar having a substantially constant width on the tapered sidewall of the first semiconductor pillar, the second semiconductor pillar doped with second conductivity type impurities that have an opposite conductivity from the first conductivity type impurities.

2. The semiconductor device of claim 1, further comprising a third semiconductor pillar on the second semiconductor pillar, the third semiconductor pillar doped with first conductivity type impurities.

3. The semiconductor device of claim 2, wherein the third semiconductor pillar has a doping concentration of the first conductivity type impurities that is at least fifty times lower than the doping concentration of the first conductivity type impurities in the first semiconductor pillar.

4. The semiconductor device of claim 2, wherein the first through third semiconductor pillars are charge balanced such that the charges in the first and third semiconductor pillars approximately equal the charges in the second semiconductor pillar.

5. The semiconductor device of claim 1, wherein the drift region is on a 4H silicon carbide substrate, and wherein the first semiconductor pillar and the second semiconductor pillar each comprise silicon carbide pillars.

6. The semiconductor device of claim 2, wherein the third semiconductor pillar surrounds the first semiconductor pillar, and the second semiconductor pillar is between the first semiconductor pillar and the third semiconductor pillar.

7. The semiconductor device of claim 1, further comprising a 4H silicon carbide substrate, wherein an active region of the semiconductor device extends along the <10-10> crystallographic direction of the substrate.

8. The semiconductor device of claim 2, further comprising a substrate that is between the lower portion of the drift region and the second contact, wherein an axis that is normal to an upper surface of the substrate that penetrates the tapered sidewall of the first semiconductor pillar also penetrates an upper portion of the third semiconductor pillar.

9. The semiconductor device of claim 8, wherein the third semiconductor pillar has a doping concentration of the first conductivity type impurities that is at least fifty times lower than the doping concentration of the first conductivity type impurities in the first semiconductor pillar.

10. The semiconductor device of claim 2, wherein a width of the first semiconductor pillar is at least three times a width of the second semiconductor pillar.

11. A semiconductor device, comprising:
a drift region having an upper surface and a lower surface;
a first contact on the upper surface of the drift region; and
a second contact on the lower surface of the drift region,
wherein the drift region includes:
  a first semiconductor pillar that is doped with first conductivity type impurities; and
  a second semiconductor pillar that is doped with first conductivity type impurities on the first semiconductor pillar,
  a third semiconductor pillar having a substantially constant width between the first semiconductor pillar and the second semiconductor pillar, the third semiconductor pillar doped with second conductivity type impurities that have an opposite conductivity from the first conductivity type impurities, wherein the first through third semiconductor pillars form a superjunction structure; and
wherein the second semiconductor pillar has a doping concentration of the first conductivity type impurities that is at least fifty times lower than a doping concentration of the first conductivity type impurities in the first semiconductor pillar.

12. The semiconductor device of claim 11, wherein the first through third semiconductor pillars are on an upper surface of a substrate, and wherein the third semiconductor pillar is tapered so that it forms an oblique angle with the upper surface of the substrate.

13. The semiconductor device of claim 11, wherein the first through third semiconductor pillars are charge balanced such that the charges in the first and second semiconductor pillars approximately equal the charges in the third semiconductor pillar.

14. The semiconductor device of claim 11, further comprising an edge termination, wherein the third semiconductor pillar is between the first semiconductor pillar and the edge termination.

15. The semiconductor device of claim 12, wherein an axis that is normal to the upper surface of the substrate penetrates both the tapered sidewall of the first semiconductor pillar and an upper portion of the second semiconductor pillar.

16. The semiconductor device of claim 12, wherein the oblique angle is less than eighty degrees or greater than 100 degrees.

17. A semiconductor device, comprising:
a drift region having an upper portion and a lower portion;
a first contact on the upper portion of the drift region; and
a second contact on the lower portion of the drift region,
wherein the drift region includes:
  a first semiconductor pillar that has a tapered sidewall;
  a second semiconductor pillar having a substantially constant width on the tapered sidewall of the first semiconductor pillar; and
  a third semiconductor pillar on the second semiconductor pillar.

18. The semiconductor device of claim 17, wherein the first semiconductor pillar is doped with first conductivity type impurities, the second semiconductor pillar is doped with second conductivity type impurities that have an opposite conductivity from the first conductivity type impurities, and the third semiconductor pillar is doped with first conductivity type impurities.

19. The semiconductor device of claim 18, wherein the third semiconductor pillar has a doping concentration of the first conductivity type impurities that is at least fifty times lower than the doping concentration of the first conductivity type impurities in the first semiconductor pillar.

20. The semiconductor device of claim 17, wherein the third semiconductor pillar has a substantially constant width.

* * * * *